United States Patent
Lee

(10) Patent No.: US 7,479,784 B2
(45) Date of Patent: Jan. 20, 2009

(54) ARRANGEMENTS, SYSTEMS AND METHODS FOR FACILITATING AND COLLECTING INFORMATION ASSOCIATED WITH FLUXES OF MAGNETIC FIELDS PROVIDED AT VARIOUS ANGLES FROM ONE ANOTHER

(75) Inventor: Ray F. Lee, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 11/548,859

(22) Filed: Oct. 12, 2006

(65) Prior Publication Data

US 2007/0080768 A1    Apr. 12, 2007

Related U.S. Application Data

(60) Provisional application No. 60/726,458, filed on Oct. 12, 2005.

(51) Int. Cl.
*G01V 3/00* (2006.01)

(52) U.S. Cl. ........................... 324/318; 600/421

(58) Field of Classification Search ............. 324/318, 324/319, 322; 600/410, 422
See application file for complete search history.

(56) References Cited

U.S. PATENT DOCUMENTS 4,608,991 A * 9/1986 Rollwitz ............... 600/410
5,363,845 A * 11/1994 Chowdhury et al. ....... 600/422
6,163,717 A * 12/2000 Su ........................... 600/422
6,313,633 B1 * 11/2001 Boskamp ................. 324/319

OTHER PUBLICATIONS

David A. Bluemke et al., "Magnetic Resonance Imaging of the Breast Priori to Biopsy", JAMA, Dec. 2004, vol. 292, No. 22, pp. 2735-2742.

Ray F. Lee et al., "Coupling and Decoupling Theory and Its Application to the MRI Phased Array", Magnetic Resonance in Medicine, 2002, 48:203, pp. 203-213.

* cited by examiner

*Primary Examiner*—Louis M Arana
(74) *Attorney, Agent, or Firm*—Dorsey & Whitney LLP

(57) ABSTRACT

Coil arrangements, systems, and methods are provided which are capable of facilitating information for imaging an anatomical structure. The arrangement may include two different coils. The first coil can produce a magnetic field in one direction and the second coil can produce a magnetic field in a second direction. The flux of the magnetic field of the first coil may be oriented at an angle other than zero and 180 degrees relative to the flux of the magnetic field of the second coil. In further exemplary embodiments, the coil elements may be in ring shapes. A shield may also be included in the arrangement and may be associate with the first and/or second coil. Connected to the coil arrangement may be a decoupling interface arrangement, which acts as an interface between the MRI scanner and the coil arrangement to decouple the coils.

15 Claims, 9 Drawing Sheets

ARRANGEMENTS, SYSTEMS AND METHODS FOR FACILITATING AND COLLECTING INFORMATION ASSOCIATED WITH FLUXES OF MAGNETIC FIELDS PROVIDED AT VARIOUS ANGLES FROM ONE ANOTHER

CROSS REFERENCE TO RELATED APPLICATIONS

This application claims the benefit of priority from U.S. Patent Application Ser. No. 60/726,458, filed Oct. 12, 2005, the entire disclosure of which is incorporated herein by reference.

FIELD OF THE INVENTION

The present invention relates generally to arrangements, systems and methods for magnetic resonance imaging ("MRI"). In particular, the present invention relates to arrangements, systems and methods for facilitating and collecting information associated with magnetic field fluxes at various angles to one another. The angles can be arranged in an orientation, e.g., orthogonal to a flux of a related magnetic field, which can be generated for imaging anatomical structures such as, but not limited to, breasts.

BACKGROUND INFORMATION

Mammography is a routine procedure for breast cancer screening and diagnosis. Penetration difficulties associated with traditional X-ray mammography technology, however, can cause both sensitivity and specificity to deteriorate for large, dense, or young breasts. MRI procedures provide a good alternative for addressing and/or overcoming such difficulties.

Although a 821 patient study at 1.5T revealed that breast MRI has a sensitivity of e.g., 88.1% and specificity of 67.7%, which may not be enough to replace mammography procedures, (see Bluemke, et al., JAMA, vol. 292, n. 22, p. 2735, the entire disclosure of which is incorporated herein by reference), it may be reasonable to expect that at higher fields, such as 7T, there may provide a significant performance improvement in breast MRI procedures.

Currently, there are a number of 7T MRI scanner types, and these scanners generally focus on brain MRI procedures. It is believed that no 7T breast MRI has yet been performed previously using the exemplary embodiments of the present invention as shall be described in detail below. Since the typical size and the dielectric constants of the breast are relatively small, the dielectric resonance effect and high specific absorption rate (SAR), which can be problematic in high fields of 7T and above, may not be pronounced.

OBJECTS AND SUMMARY OF THE INVENTION

One exemplary object of the present invention is to achieve a higher resolution for imaging anatomical structures, tissue, and/or organs. Such higher resolution for imaging may be used with, e.g., breast MRI procedures and can meet or exceed 0.3 mm×0.3 mm. Resolution may further exceed that of 1.5T and 3T scanners, typically having resolutions greater than 7 mm×7 mm. A further exemplary object of the present invention is to detect abnormalities or diseases in the breast and/or other anatomical structures or organs. Such detection may include a detection of e.g., breast cancer at various stages, including the stages when the cancerous tissue is significantly smaller by conventional techniques.

An exemplary embodiment of the present invention is directed to arrangements, systems and methods which may be capable of facilitating information for imaging an anatomical structure. For example, the exemplary arrangement may include a first coil that is capable of generating a magnetic field in one direction. A second coil may be provided that is capable of generating a magnetic field in a second direction. The magnetic field flux of the first coil may be oriented at an angle other than zero or 180 degrees relative to the magnetic field flux of the second coil. In addition, or as an alternative, the first and/or second coils may be provided in the shape of a ring. A shield, associated with the first and/or second coil, may also be provided with the exemplary arrangement. A decoupling assembly, which can be an interface between an MRI scanner and the coil arrangement, may also be provided.

BRIEF DESCRIPTION OF THE DRAWINGS

The foregoing and other objects of the present invention will be apparent upon consideration of the following detailed description, taken in conjunction with the accompanying drawings and claims, in which like reference characters refer to like parts throughout, and in which:

Figure 1:
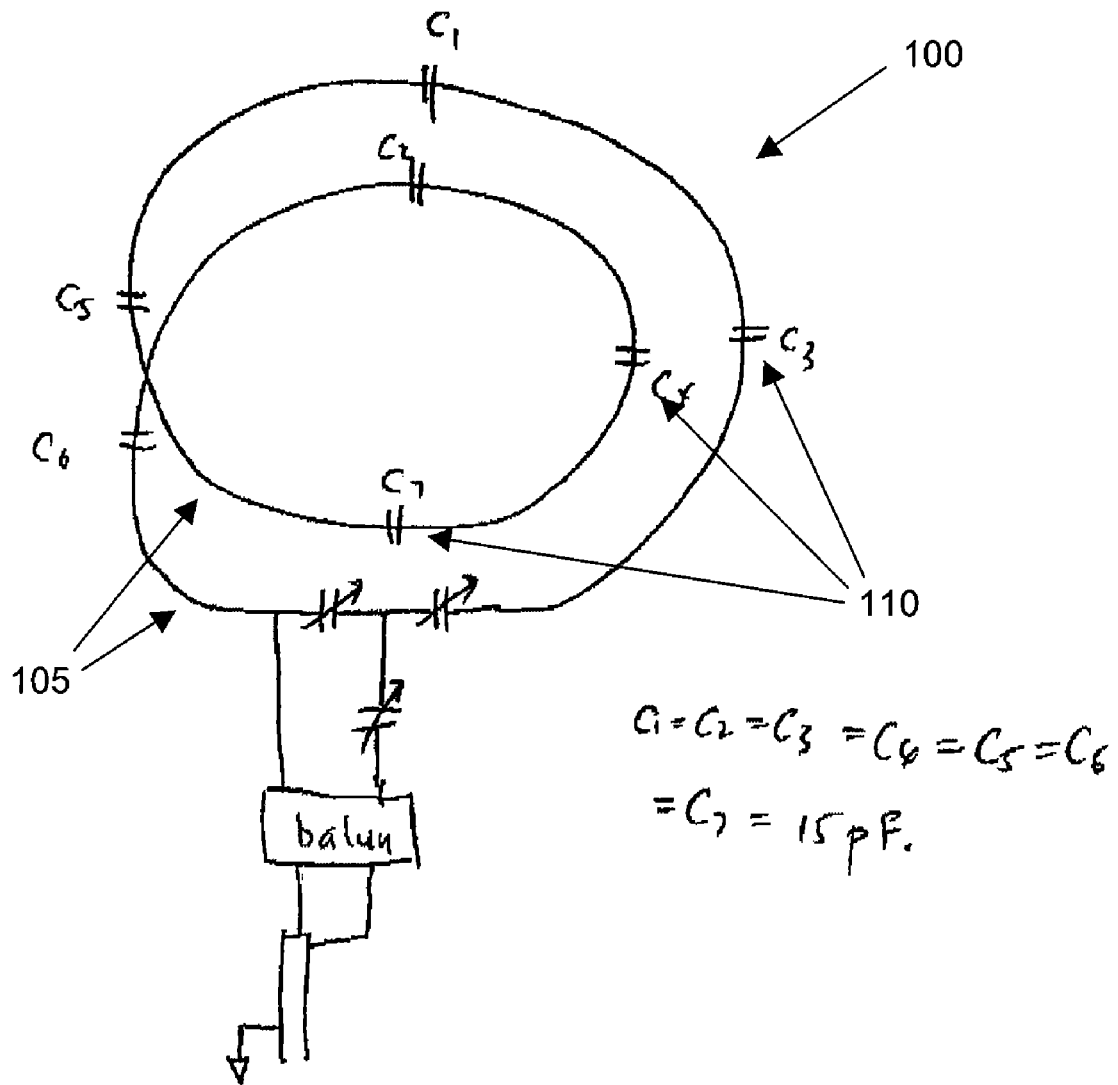
FIG. 1 is a schematic diagram of an exemplary layout of an orthogonal volume coil arrangement according to an exemplary embodiment of the present invention.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments.

DETAILED DESCRIPTION OF THE INVENTION

With the orientation, geometry, and position of certain anatomy such as the breast it is possible to use one or more solenoids with distributed capacitors to produce images of the anatomic samples at high fields in an arrangement that has a flux orthogonal to the static magnetic field in the exemplary MRI system. Typically, static magnet fields are horizontal in such MRI systems. With the typical horizontal static magnetic field, an exemplary embodiment of the present invention can include a vertical coil arrangement to produce images. The solenoids of an exemplary MRI system can be combined with a shield arrangement further described herein. Alternatively, in the MRI system with a vertical static magnetic field, an exemplary embodiment of the arrangement according to the present invention can include a horizontal coil arrangement to produce images.

Referring to FIG. 1, a schematic diagram of an exemplary embodiment of a coil arrangement 100 according to the present invention is provided. The coil arrangement 100 may include a solenoid. The solenoid may consist of one or more arc-shaped or loop-shaped elements 105, which may be contiguous, and capacitors 110 placed in series along the arc-shaped or loop-shaped elements. The capacitors may be evenly spaced. The number of the capacitors 110 can be varied and may be adjusted depending on desired values. More of the capacitors 110 may be used with a higher capacitance, or fewer of its capacitors 110 may be used with a lower capacitance. Given a resonance frequency ("RF") and the relationship $$RF = \frac{1}{2\Pi\sqrt{LC}},$$

where 'L'=inductance and 'C'=capacitance, the total capacitance preferably used can be at a fixed RF for each field strength (e.g. 1.5T, 3T, 7T). The resulting capacitance can be spread across the set of capacitors. For example, the coil capacitors 110 can have equal values. According to one exemplary embodiment of the present invention, the coil capacitors 110 can be 15 pF each.

Figure 2:
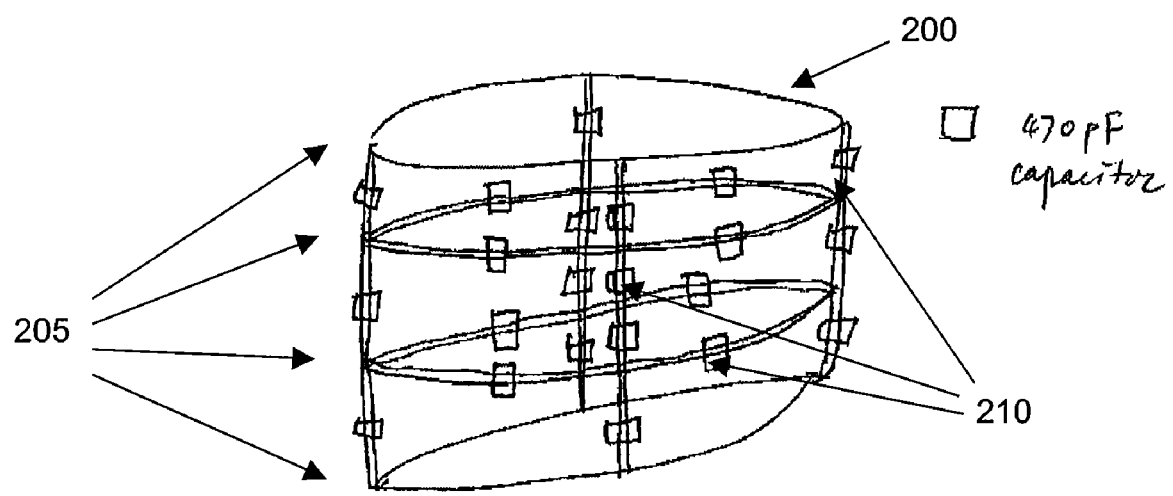
FIG. 2 is a schematic diagram of an exemplary layout of a shield arrangement that can be associated with the volume coil of FIG. 1 according to an exemplary embodiment of the present invention.

Referring to FIG. 2, a schematic diagram of an exemplary embodiment of a shield arrangement 200 according to the present invention can be provided. The shield arrangement may be provided to facilitate an electrical isolation and to eliminate or reduce eddy currents (e.g. at low frequency). The shield arrangement 200 may include of a one or more segments, which may be coupled together. For example, the shield segments can be made from a hollow cylinder of metal, such as copper. Two or more cylinders may be stacked with a spacing between the cylinders. The spacing is typically 1 cm to 2 cm, but may vary. The cylinders are typically 20 cm height, but may vary. The cylinders can be separated or cut into sections 205, the number of which can be, e.g., 4, but may vary. The sections 205 may be joined together with capacitors 210 (e.g., shield capacitors). The shield capacitors can have an equal value of 470 pf, but may vary.

When the magnetic flux of the one solenoid is vertically perpendicular to the B0 direction (e.g., surface of the earth), another solenoid may also be utilized, which can have a magnetic flux that is horizontal and perpendicular with respect to the B0 direction. In such case, it would be possible to achieve a circular polarized 7T volume coil which could potentially increase SNR up to 1.414 times.

An exemplary loop array for the head may not be an ideal arrangement for performing breast MRI procedures due to the special orientation of the breast. If using a typical head array coil for breast, some of the loops may have their magnetic field flux being parallel to the B0 direction and are, therefore, possibly less useful for transmitting and receiving signals.

Figure 9:
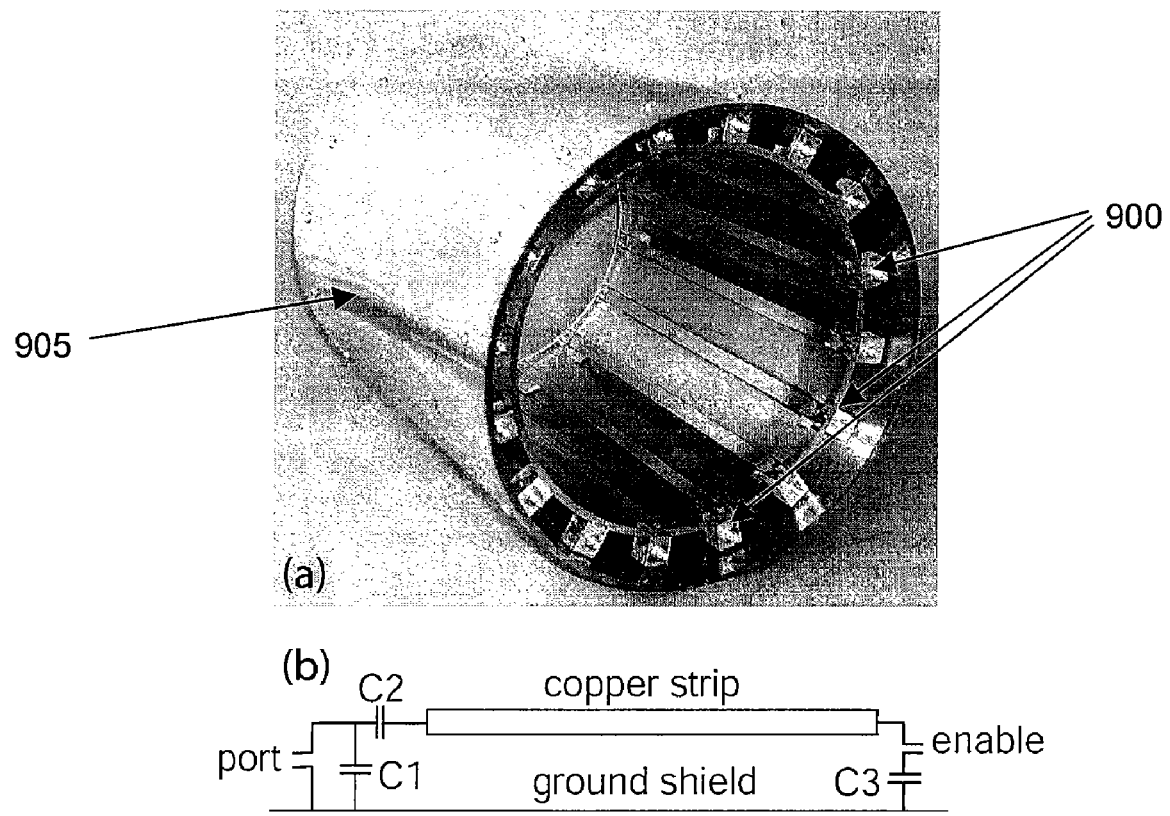
FIG. 9(a) is an exemplary image of a volume strip array ("VSA"), having a shield according to an exemplary embodiment of the present invention.
FIG. 9(b) is a schematic diagram of the exemplary image of an array of FIG. 9(a) according to an exemplary embodiment of the present invention.

Referring to FIG. 9, an exemplary image of a VSA 900 according to the present invention is provided. An exemplary embodiment of the VSA 900 has been described in U.S. Patent Application No. 60/658,139 filed on Mar. 2, 2005, the entire disclosure of which is incorporated herein by reference. The VSA 900 is an applicable and potentially beneficial use with structure for the exemplary embodiment of a linear polarized coil according to the present invention, the exemplary embodiment of which is shown in FIG. 9. Further, the VSA 900 may be combined with an exemplary embodiment of a shield 905 according to the present invention.

Figure 3:
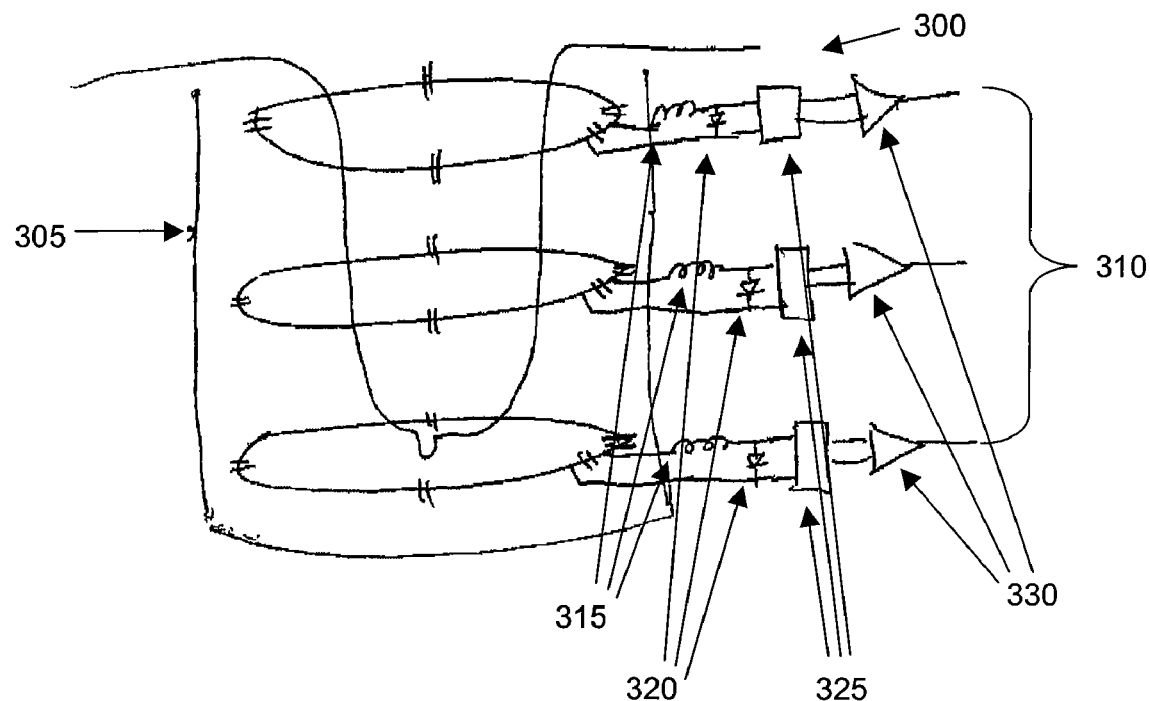
FIG. 3A is a schematic diagram of an exemplary layout of a ring array according to an exemplary embodiment of the present invention.
FIG. 3B is a schematic, enlarged diagram of an array coil of this array illustrated in FIG. 3A.
Figure 3:
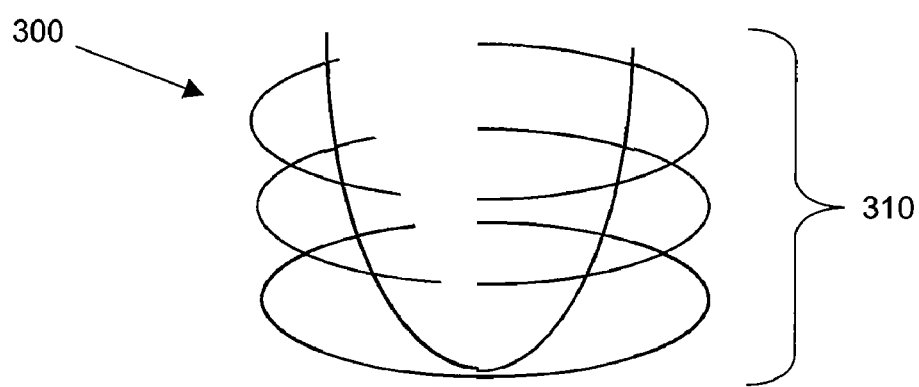

Referring to FIGS. 3A and 3B schematics are diagrams of an exemplary embodiment of a ring array 300 according to the present invention are provided. The exemplary 305 ring array comprises an array coil 310 and a shield 305. The array coil 310 can include at least one loop array coil. In the exemplary embodiment of the ring array 310 of the present invention, the loops can be provided at different heights or points on a Z axis. The rings may be concentric, and can have associated circuit elements of loop arrays including but not limited to inductors 315, diodes 320, balun 325, and preamplifiers 330. A shield, as described herein, may be provided around the ring array 300. The area inside the ring array 300 can provide for and/or facilitate a superior high field imaging of anatomical tissue, organs, and structures such as, without limitation, the breast.

Figure 4:
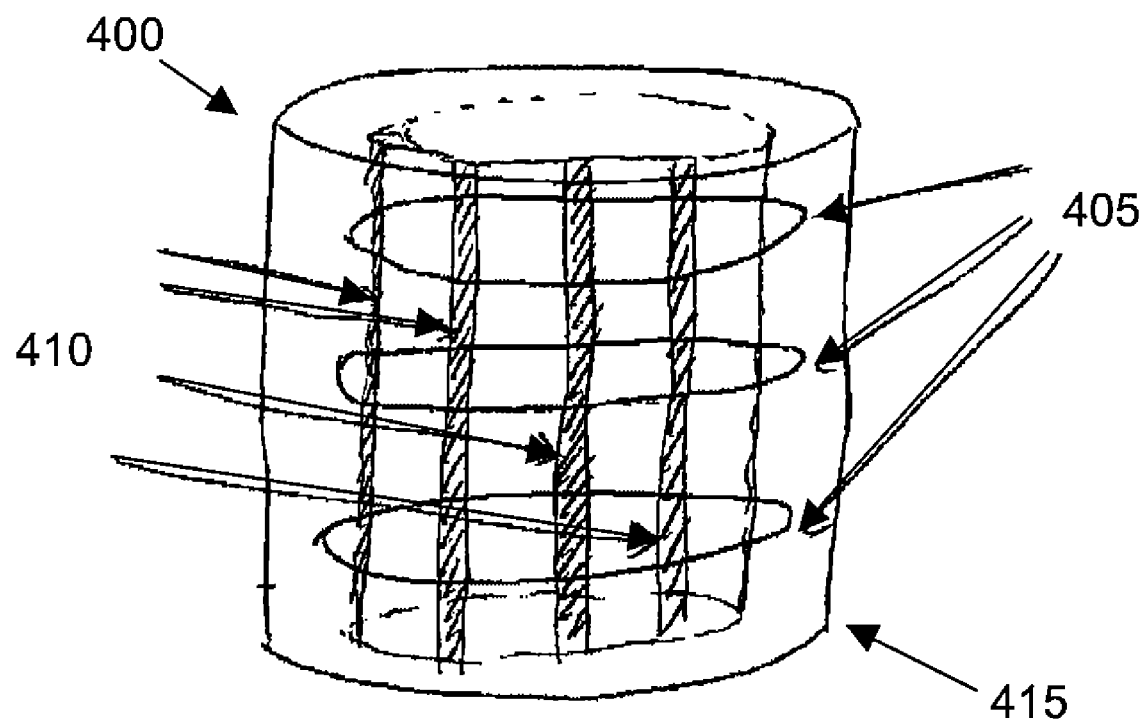
FIG. 4 is a schematic diagram of an exemplary layout of a circular polarized array according to an exemplary embodiment of the present invention.

Referring to FIG. 4, a schematic diagram of an exemplary embodiment of a circular polarized array 400 according to the present invention is provided. The depicted circular polarized array 400 can combine a ring array 405 and a VSA 410. The ring array 405 may comprise an array coil as described herein above with reference to FIGS. 3A and 3B. The exemplary shield 415 is as depicted in FIGS. 2 and 9. The combination of the VSA 410 with the ring array and the shield further provides for and/or facilitates a superior high field imaging of anatomical tissue, organs, and structures such as, without limitation, the breast.

Due to a certain exemplary orientation of the female breast in relation to the horizontal static magnetic field, a solenoid with distributed capacitors may be used for performing, e.g., breast MRI procedures. At 7T, however, it can be difficult to tune solenoids alone efficiently. An additional segmented RF shield may be included to reduce both inductance of the solenoid and a radiation loss at 300 MHz. The segmentation in the shield can function to eliminate or reduce the low frequency eddy current. Large value capacitors can be provided between segments, e.g., every pair of segments may be used to provide high frequency electromagnetic frequency ("EMF") short circuits.

Figure 5:
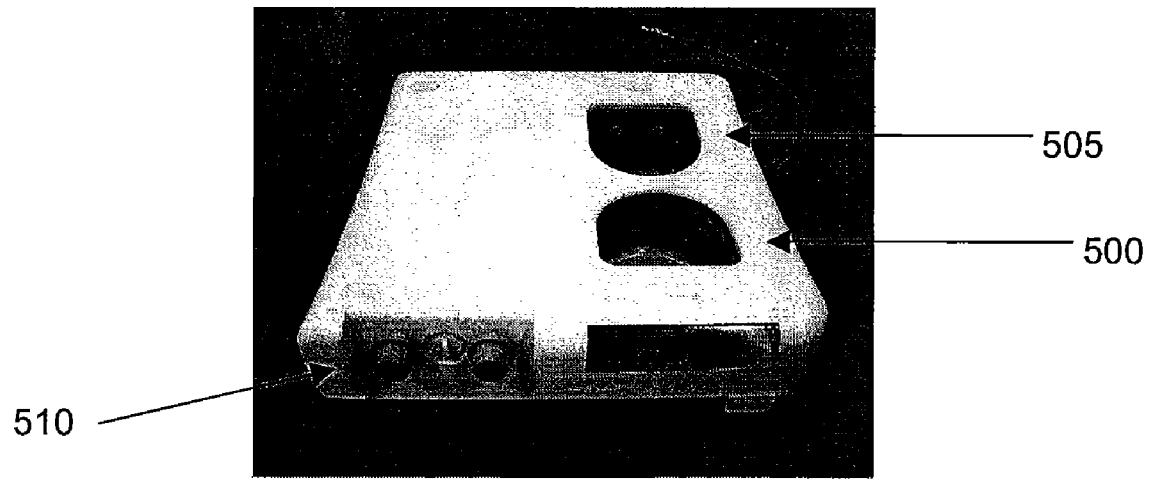
FIG. 5 is a visual illustration of an exemplary embodiment of an arrangement according to the present invention consisting of a 7T breast coil in a covered configuration.
Figure 6:
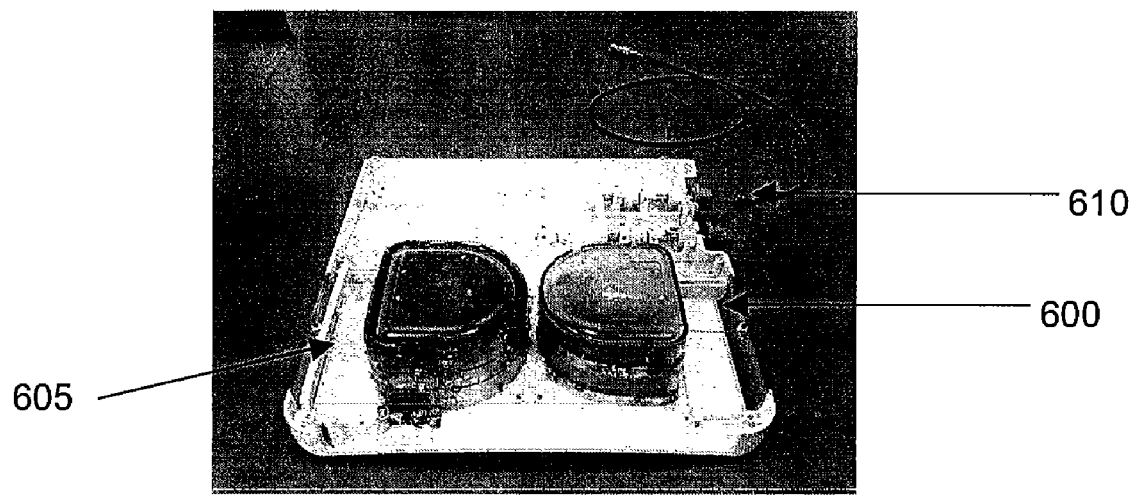
FIG. 6 is a visual illustration of an exemplary embodiment of the arrangement of FIG. 5 in an uncovered configuration.

Referring to FIGS. 5 and 6, exemplary images of an exemplary embodiment of a coil arrangement are provided. As shown in these exemplar images, two openings: one for the left breast 500, 600 and a second for the right breast 505, 605. The knobs 510, 610 can be used to move plates which may squeeze or otherwise position the breast for imaging. In accordance with one exemplary embodiment of the present invention, the coil arrangement can comprise a volume coil, which may further be a linear polarized orthogonal volume coil. In another embodiment, the coil arrangement comprises a circular polarized orthogonal volume coil.

Figure 7:
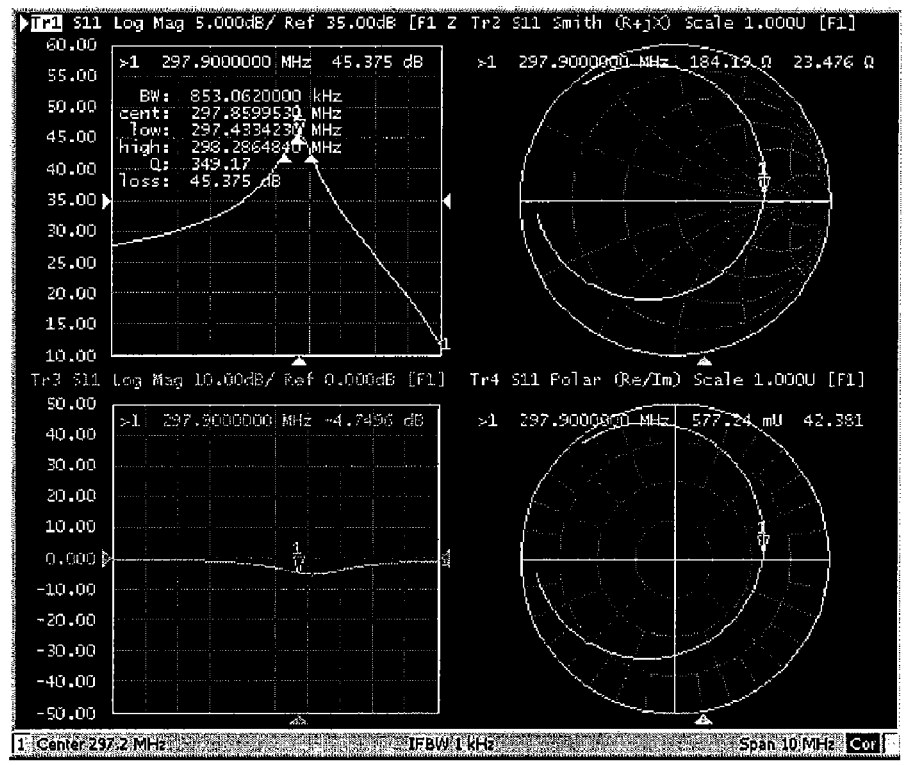
FIG. 7A are exemplary graph illustrating output of a network analyzer showing the performances of an exemplary embodiment of the present invention consisting of the 7T breast coil of FIG. 5 as loaded.
FIG. 7B are exemplary graph illustrating output of a network analyzer showing the performances of an exemplary embodiment of the present invention consisting of the 7T breast coil of FIG. 5 as unloaded.
Figure 7:
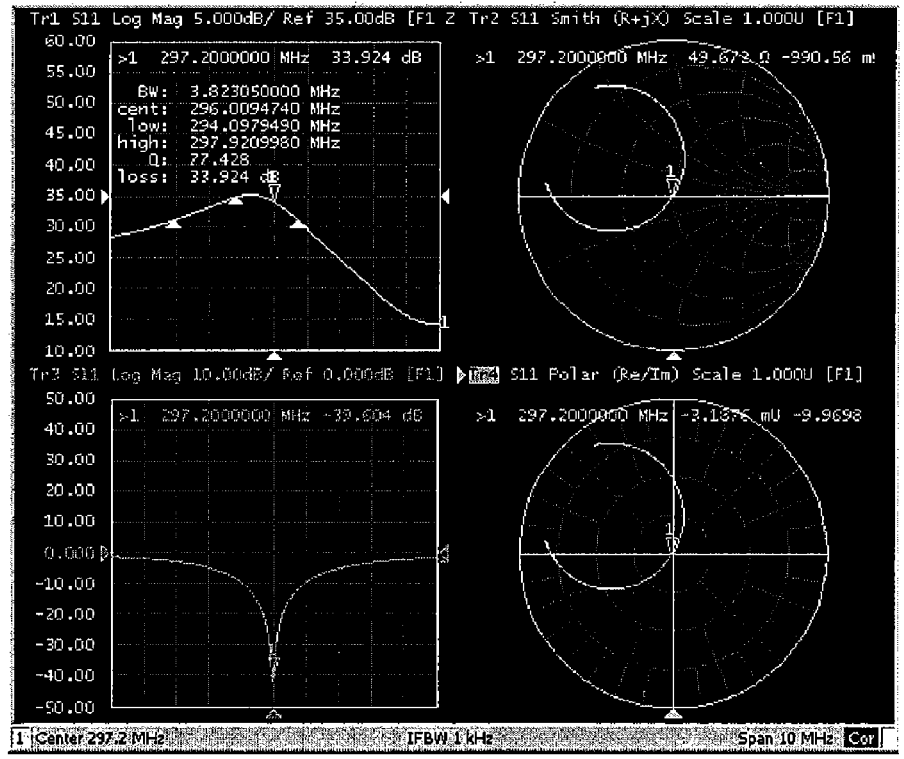
Figure 8:
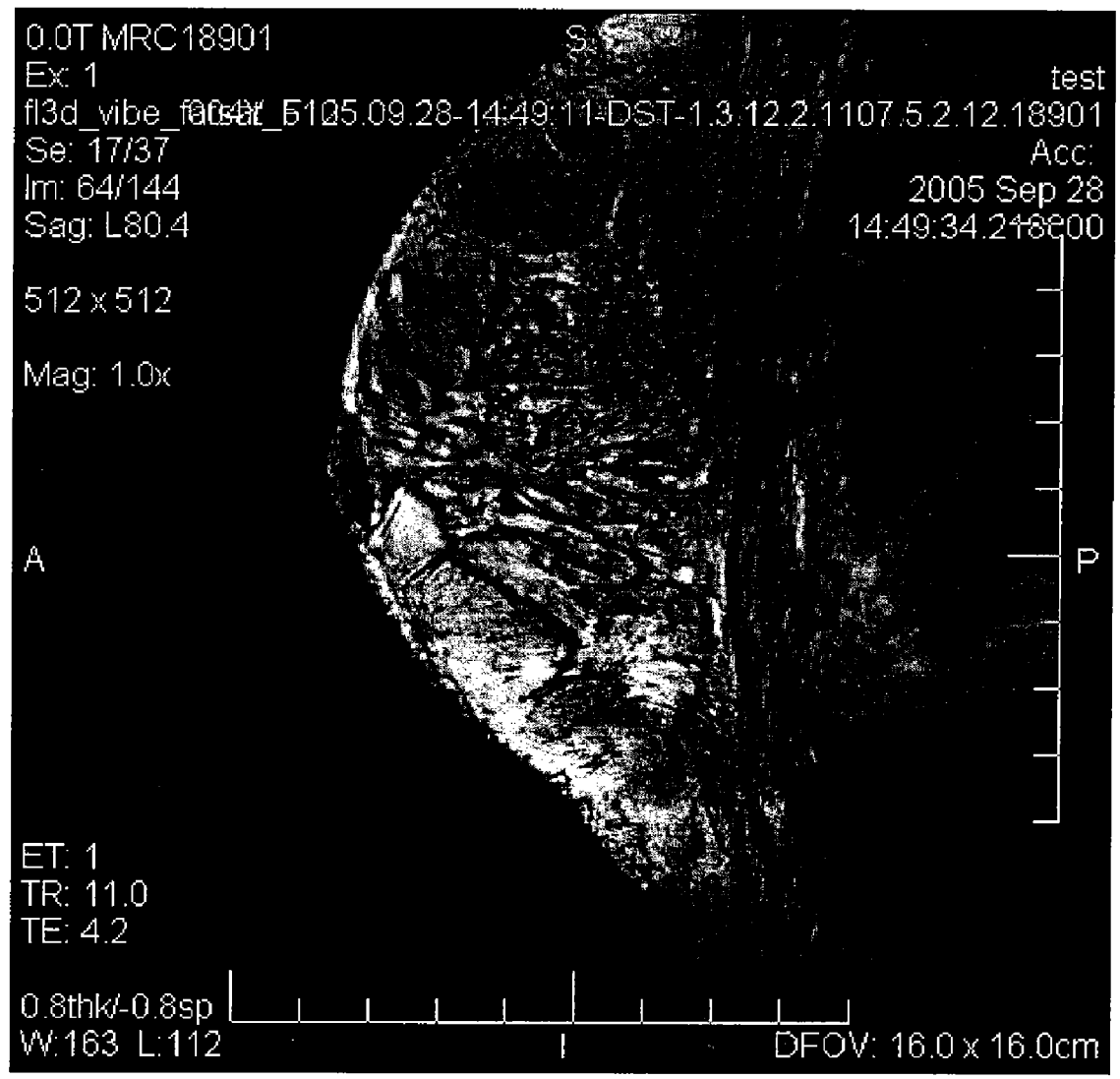
FIG. 8 is an exemplary image illustrating the output of a network analyzer showing a performance of an exemplary embodiment of the present invention consisting of the 7T breast coil of FIG. 6.

Referring to FIGS. 7A and 7B, exemplary graphs illustrating the 7T breast coil's loaded and unloaded performances, respectively, are provided. These exemplary graphs illustrate performances, where the typical unloaded Q-factor is approximately 349, the loaded Q-factor is approximately 77, and the input impedance can be matched to e.g., 50 ohm when the coil is loaded. Referring to FIG. 8, an exemplary illustration of a T1 weighted high resolution breast MR image from the 7T breast coil is provided.

Other anatomical structures may also be suitable for use with the exemplary embodiments of the present invention. These may include, without limitation, extremities of the human body such as the foot or toe.

After an exemplary spatial encoding with magnetic field gradients is performed, the MR signals can be detected by the orthogonal high field coils, such as the exemplary breast coils. The signals detected by the coils may provide to one or more preamplifiers, and then to one or more receivers, where they can be digitized and transmitted to a computing arrangement. When certain transforms are applied, such as the Fast Fourier Transform, the data stored in a storage arrangement of the computing arrangement may be converted to one or more MR images.

In conventional MRI phased-array designs, overlapping coils can be used to minimize coupling between the nearest-neighbor coils, and low input impedance preamplifiers may be used to isolate the relatively weak coupling between the non-nearest neighbors. These decoupling procedures may not be universally applicable to every coil arrangement. To make complex sensitivities of the phased-array coils sufficiently distinct in parallel spatially-encoded MRI, it may be beneficial to have little or no overlapping of coils. Additionally, if the phased array coils are used as transmit coils in the MRI system, a low input impedance of the preamplifiers may be less reliable for decoupling. As an exemplary alternative, decoupling of an n-element phased array may be achieved by introducing a 2n-port interface system between the phased array and the preamplifiers.

Figure 10:
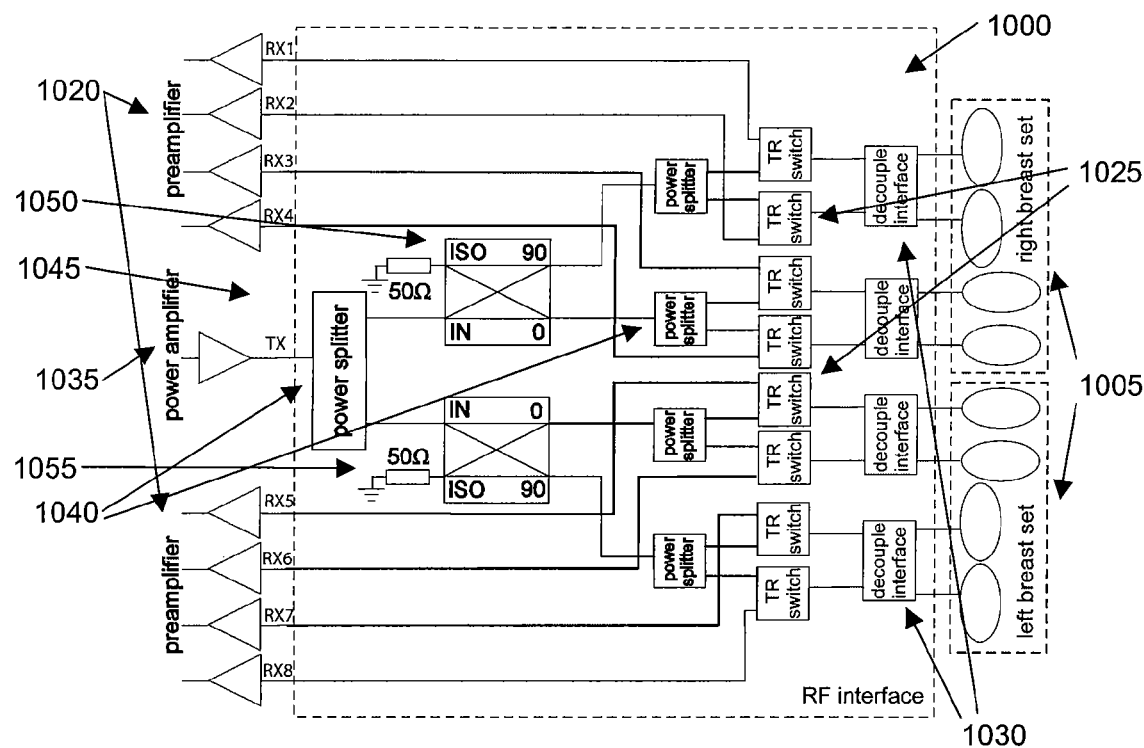
FIG. 10A is a schematic diagram of an exemplary interface system configured to be provided between an MRI scanner and an exemplary coil arrangement according to an exemplary embodiment of the present invention.
FIG. 10B is a diagram of an 8-channel coil structure according to the exemplary embodiment of the present invention.
FIG. 10C is a schematic diagram of an exemplary embodiment of a decoupling interface according to the present invention.
Figure 10:
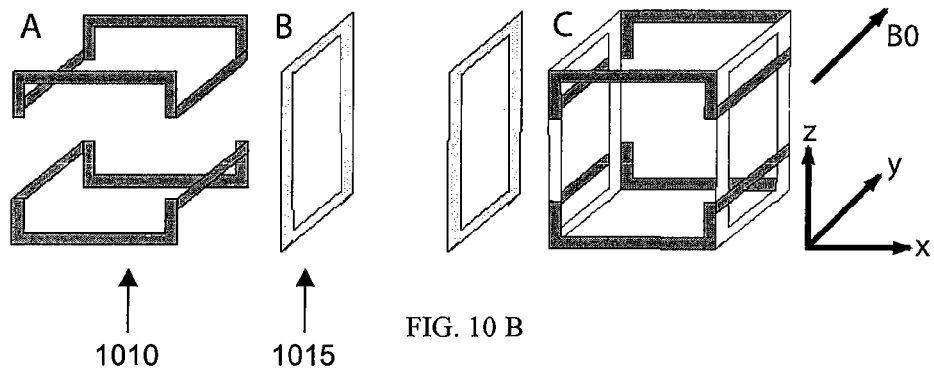
Figure 10:
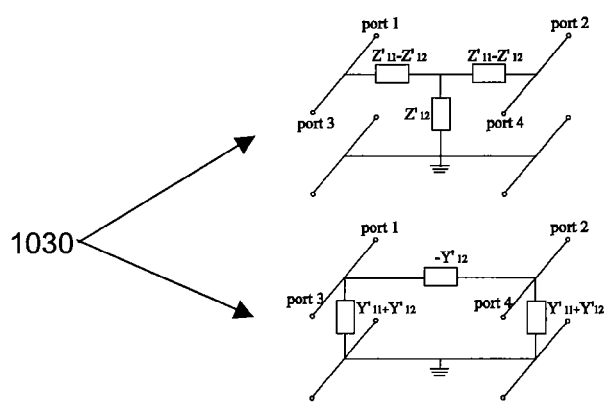

Referring to FIG. 10A, a schematic diagram of an exemplary embodiment of an interface system 1000 configured to be provided between an MRI scanner and an exemplary coil according to the present invention is provided. The exemplary coil can be an 8 channel breast coil 1005, but other various other numbers of coils and coil elements are possible and are within the scope of the present invention. Referring to FIG. 10B, a diagram for an exemplary 8 channel coil structure according to the present invention is provided. The exemplary diagram shows four elements in one side of a breast coil e.g., two on z-axis coils 1010 and two on x-axis coils 1015. Another side of the breast coil can be a mirror configuration. In addition to the four elements, a RF shield surrounding the structure according to the present invention. For each of the eight channels of the coil, there may be an associated preamplifier 1020 and a transmit and receive ("TR") switch 1025. The TR switch 1025 may have multiple ports, and can function to coordinate, transmit, and/or receive operations. While the exemplary embodiment of the TR switch described herein has three ports, there may be more ports or less. An intermediate component 1020, such as an decoupling interface 1025, may be connected through one of the TR ports.

Referring to FIG. 10C, a schematic diagram of an exemplary embodiment of a decoupling interface according to the present invention is provided. The decoupling between the coaxial coils can be achieved by one or both of the two decoupling interfaces 1030. Although there may be multiple decoupling interfaces associated with the coil arrangement, distinct decoupling interfaces may be used for each coil and/or coil element. Another port of the TR switch may be connected to a pre-amplifier 1020, which may in turn be connected to a receiver as shown in FIG. 10A. Another port of the TR switch may be connected to a transmitter and/or a transmit power amplifier 1035, possibly, through one or more intermediate components, such as a power splitter 1040.

A hybrid element 1045 may be provided in association with one or more of the power splitters as shown in FIG. 10A. Power may be provided to the hybrid element and forwarded to two or more ports. The outputs of the ports may be provided at various phase relationships among the output ports of the hybrid element 1045. In the exemplary embodiment of the interface system according to the present invention, two outputs may be provided at 90 and/or zero degrees relative to one another. However, other phase relationships may be used. Although the outputs may be provided at the same magnitude or at different magnitudes, the exemplary embodiment of the interface system according to the present invention may provide outputs at the same magnitude and with zero and/or 90 degree phases relative to each other. The hybrid element may have multiple inputs. One or more inputs can be a power input as received from a power amplifier 1035. Another input may be an isolation input 1050. This input 1050 may interface with a resistor 1055, which may act as a terminator and may have a preferable value of 50 ohms. An exemplary resistance value of 50 ohms can relate to typical 50 ohm components and elements, such as coaxial cable, as well as other components and elements that may be compatible with 50 ohms. Other termination values are possible, such as 75 ohms, and may be matched or interfaced with components compatible with various other resistance values.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements, and methods which, although not explicitly shown or described herein, embody the principles of the invention and are thus within the spirit and scope of the invention. In addition, all publications and references referred to above are incorporated herein by reference in their entireties.

What is claimed is:

1. An arrangement comprising:
   at least one first coil capable of generating a first magnetic field in a first direction;
   at least one second coil capable of generating a second magnetic field in a second direction; and
   at least one shield surrounding at least one of the first coil or the second coil, wherein one of the at least one first coil or the at least one second coil is configured for use with at least one side of at least one breast and the other of the at least one first coil or the at least one second coil is configured for use with at least another side of the at least one breast, wherein the arrangement is configured to be used in magnetic fields of 7T or greater, and wherein the at least one shield is structured so as to substantially reduce a loss of radiation generated by at least one of the at least one first coil or the at least one second coil.

2. The arrangement of claim 1, wherein at least one of the at least one first coil or the at least one second coil is a solenoid.

3. The arrangement of claim 1, wherein at least one of the at least one first coil or the at least one second coil is provided in the shape of a shape of a ring.

4. The arrangement of claim 1, wherein at least one of the at least one first coil or the at least one second coil is provided in a volume strip array.

5. The arrangement of claim 1, wherein one of the first and second coils is provided in a shape of a ring, and wherein another one of the first and second coils is provided in a volume strip array.

6. The arrangement of claim 1, wherein one of the first and second coils is a solenoid, and wherein another one of the first and second coils is provided in a volume strip array.

7. The arrangement of claim 1, wherein the first flux of the first magnetic field of the first coil is approximately orthogonal to the second flux of the second magnetic field of the second coil.

8. The arrangement of claim 1, wherein at least one of the at least one first coil or the at least one second coil comprises one or more capacitors provided in series in the at least one of the first and second coils.

9. The arrangement of claim 1, wherein both the first and second coils are provided in the shape of a ring, and the at least one first coil is parallel with the at least one second coil, and wherein the at least one first coil is provided at a predetermined distance from the at least one second coil.

10. The arrangement of claim 1, further comprising an interface arrangement which communicates with a first number of outputs from at least one of the first or second coils; and including a second number of ports, wherein the second number is double of the first number, and wherein the interface arrangement is configured to connect to an magnetic resonance imaging system.

11. The arrangement of claim 10, wherein the interface arrangement is configured to connect to at least one of the at least one first coil or the at least one second coil via a decoupling interface.

12. The arrangement of claim 1, wherein the reduction in the radiation loss yields an unloaded Q-factor of at least approximately 350.

13. The arrangement of claim 1, wherein the reduction in the radiation loss yields a loaded Q-factor of at least approximately 75.

14. The arrangement of claim 1, wherein the at least one shield is structured so as to substantially eliminate the loss of radiation generated by at least one of the at least one first coil or the at least one second coil.

15. The arrangement of claim 1, wherein the arrangement is configured to generate a circular polarized field during use thereof.

* * * * *